United States Patent
Beernink et al.

(10) Patent No.: US 6,803,513 B2
(45) Date of Patent: Oct. 12, 2004

(54) SERIES CONNECTED PHOTOVOLTAIC MODULE AND METHOD FOR ITS MANUFACTURE

(75) Inventors: Kevin Beernink, Clarkston, MI (US); Eric Akkashian, Ferndale, MI (US)

(73) Assignee: United Solar Systems Corporation, Troy, MI (US)

( * ) Notice: Subject to any disclaimer, the term of this patent is extended or adjusted under 35 U.S.C. 154(b) by 0 days.

(21) Appl. No.: 10/223,969

(22) Filed: Aug. 20, 2002

(65) Prior Publication Data

US 2004/0035458 A1 Feb. 26, 2004

(51) Int. Cl.[7] ................ H01L 31/042; H01L 31/05
(52) U.S. Cl. ................ 136/244; 136/251; 136/256; 136/255; 136/249; 257/433; 257/458; 257/457; 257/443; 438/80; 438/98; 438/67; 438/72; 438/74
(58) Field of Search .................. 136/244, 251, 136/256, 255, 249; 257/433, 458, 457, 443; 438/80, 98, 67, 72, 74

(56) References Cited

U.S. PATENT DOCUMENTS

| | | | | |
|---|---|---|---|---|
| 3,483,038 A | * | 12/1969 | Hui et al. | 136/244 |
| 4,617,420 A | * | 10/1986 | Dilts et al. | 136/244 |
| 5,084,107 A | | 1/1992 | Deguchi et al. | 136/256 |
| 5,151,373 A | | 9/1992 | Deguchi et al. | 156/274.8 |
| 5,158,618 A | * | 10/1992 | Rubin et al. | 136/244 |
| 5,259,891 A | * | 11/1993 | Matsuyama et al. | 136/244 |
| 5,457,057 A | * | 10/1995 | Nath et al. | 438/67 |
| 5,575,861 A | * | 11/1996 | Younan et al. | 136/251 |
| 5,681,402 A | * | 10/1997 | Ichinose et al. | 136/256 |
| 5,759,291 A | | 6/1998 | Ichinose et al. | 136/256 |
| 6,414,235 B1 | * | 7/2002 | Luch | 136/244 |

* cited by examiner

Primary Examiner—Alan Diamond
(74) Attorney, Agent, or Firm—Gifford, Krass, Groh, Sprinkle, Anderson & Citkowski, P.C.

(57) ABSTRACT

A photovoltaic module includes at least a first and a second photovoltaic cell each having a substrate electrode, a top electrode and a photovoltaic semiconductor body disposed therebetween in electrical communication with the substrate electrode and the top electrode. Each cell includes a plurality of current collecting grid wires disposed atop the top electrode in electrical contact therewith. The grid wires of the first cell are in electrical communication with a current collecting bus bar and the grid wires of the second cell extend onto the first cell so as to establish an unbroken current path therebetween. The grid wires of the second cell may establish electrical communication with the substrate electrode of the first cell, in which case a series connection therebetween is established. Alternatively, the grid wires of the second cell may establish electrical communication with the top electrode of the first cell so as to create a parallel electrical connection therebetween. Also disclosed are methods for manufacturing the modules.

24 Claims, 6 Drawing Sheets

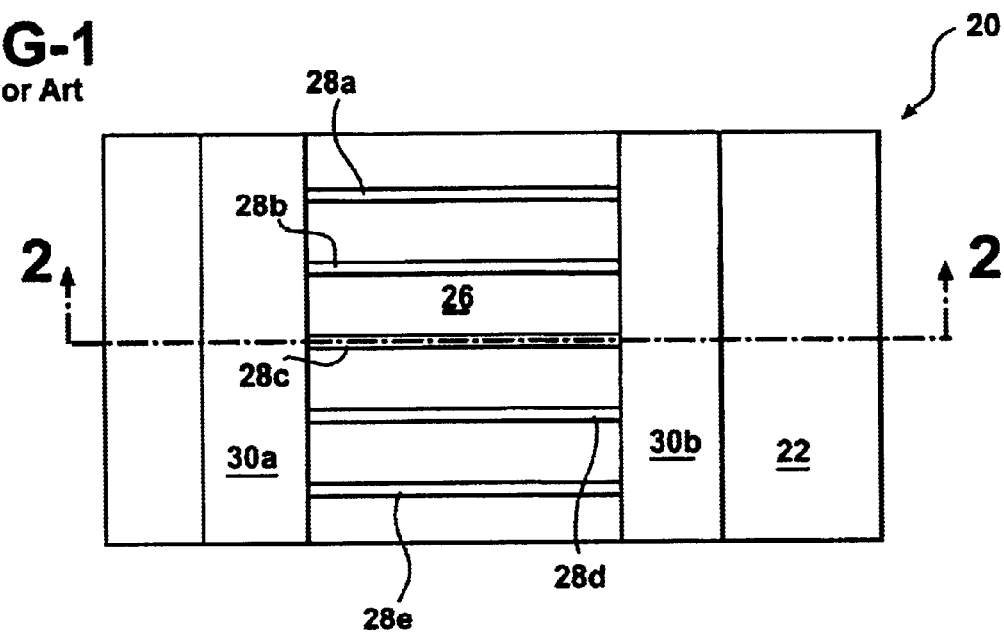
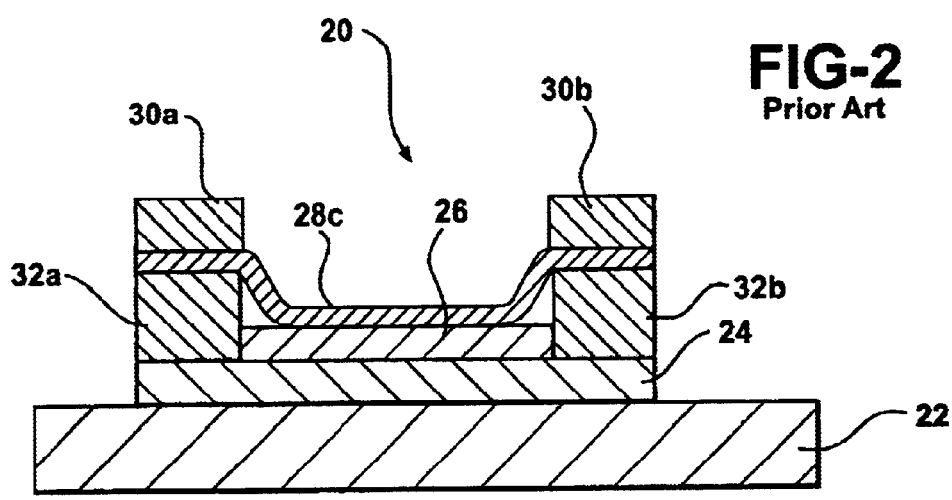
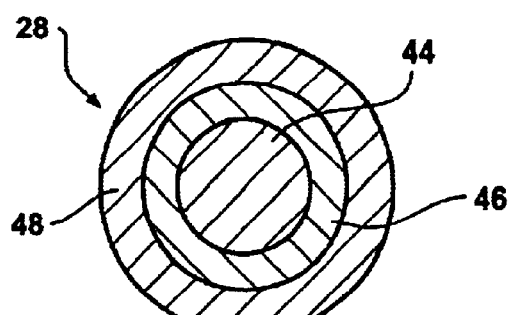

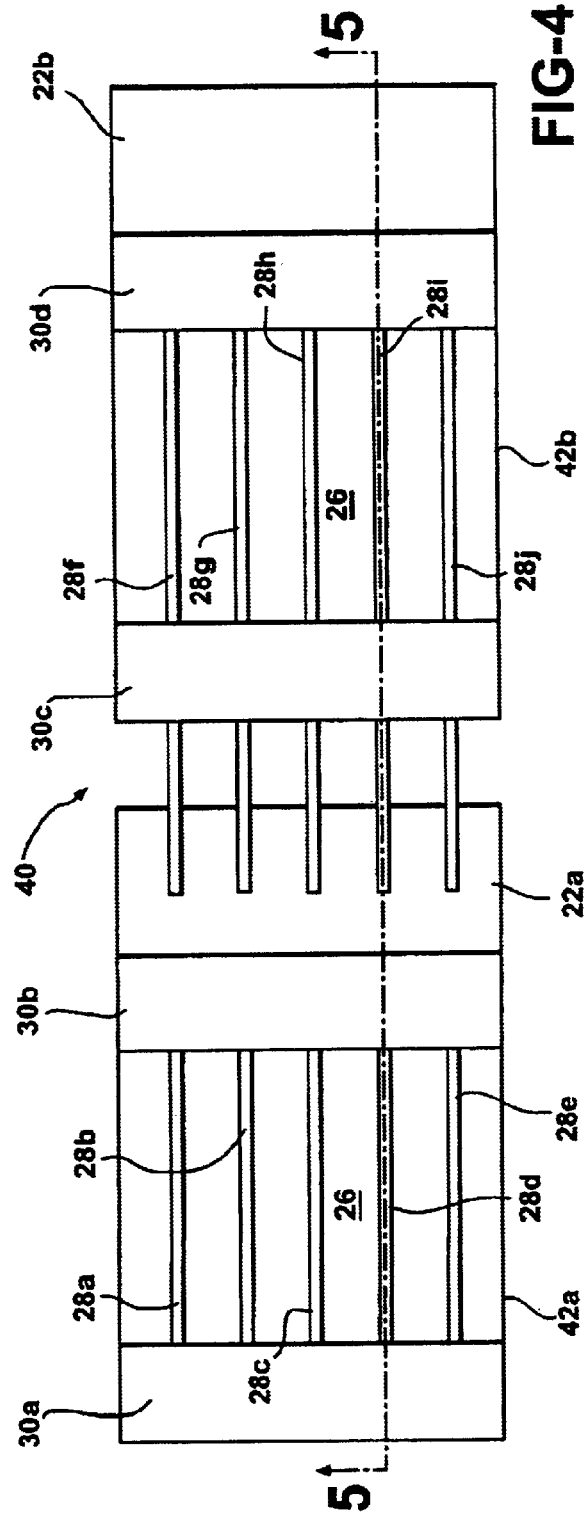
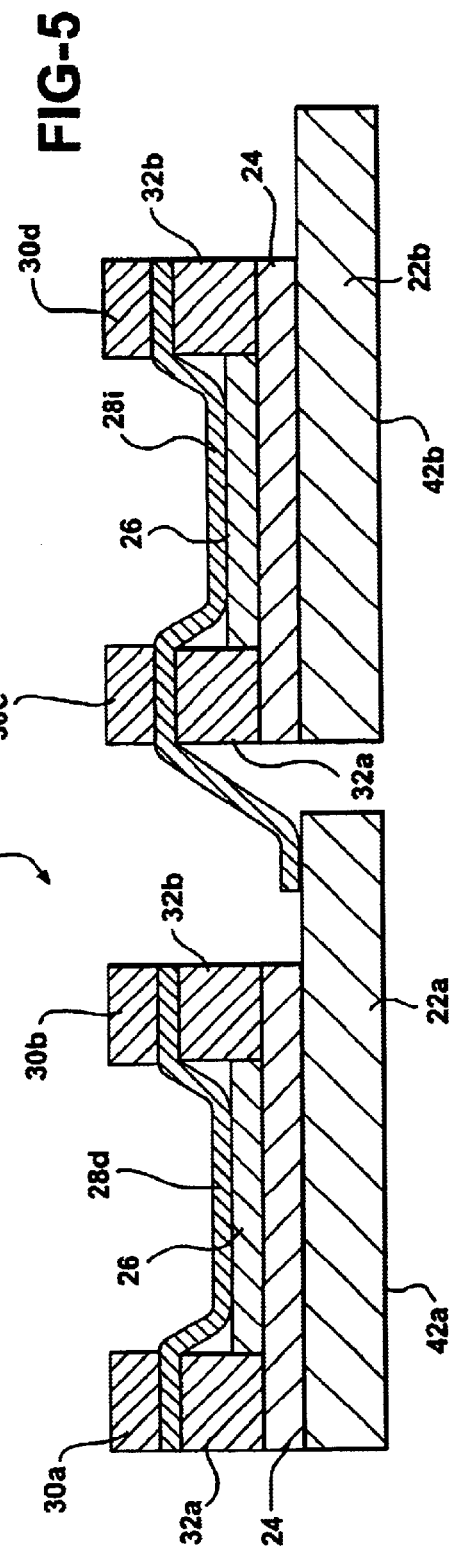

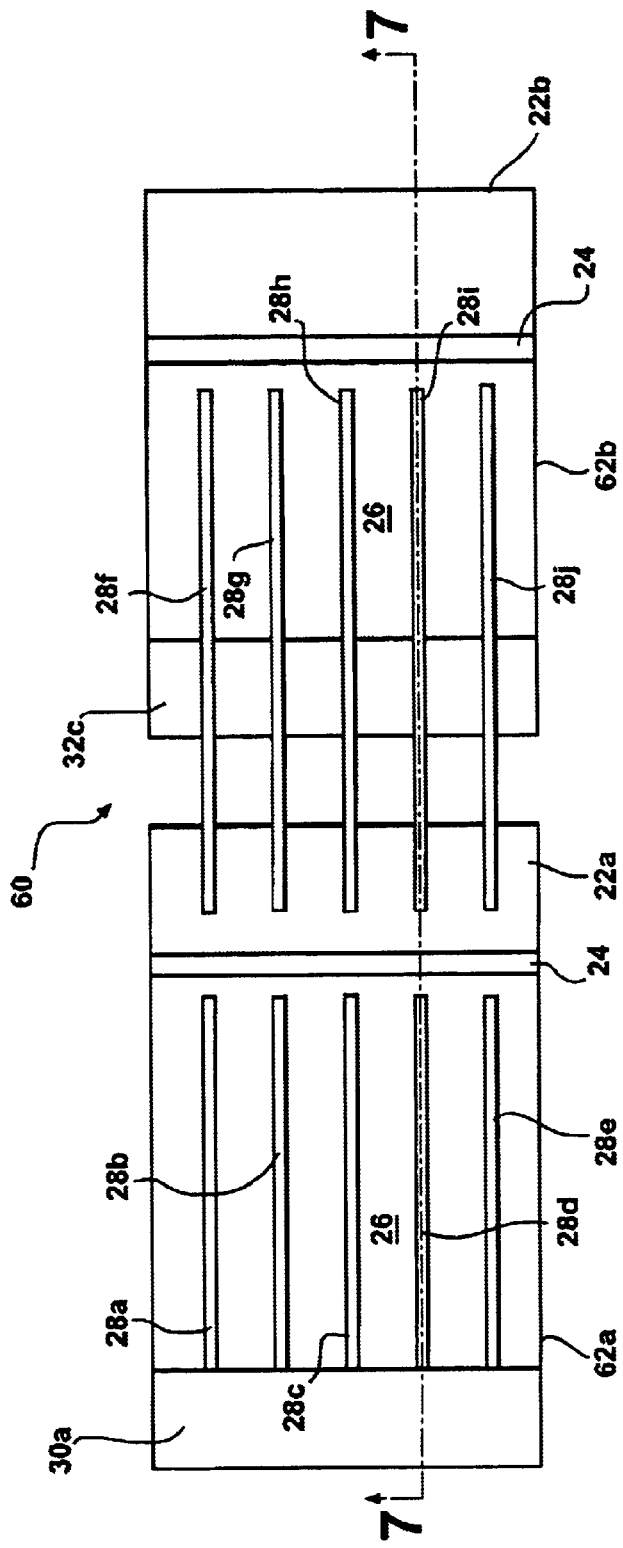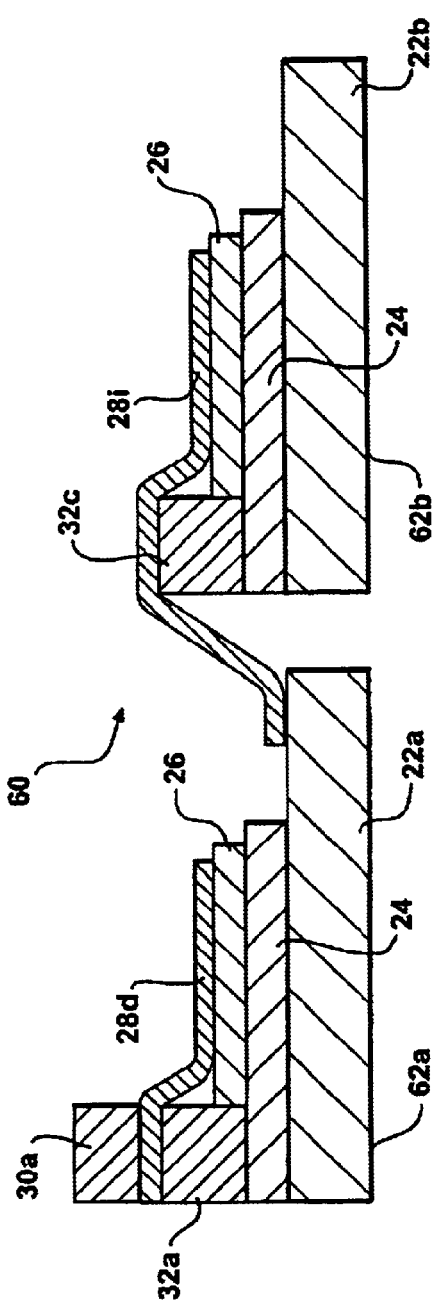

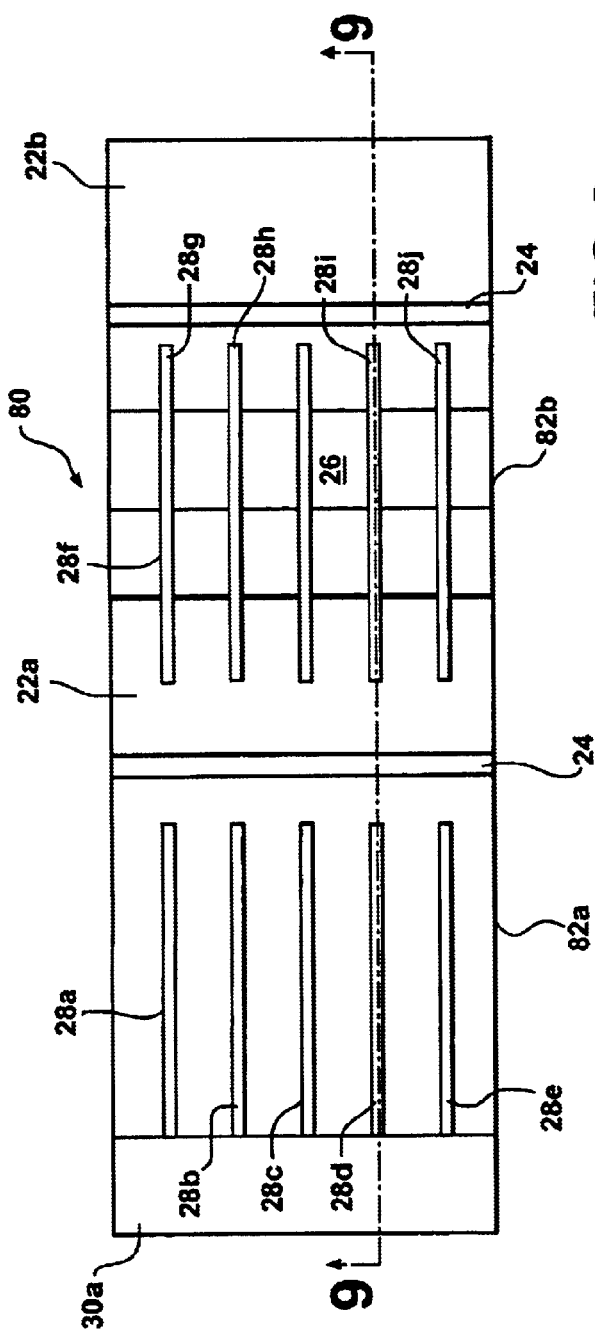
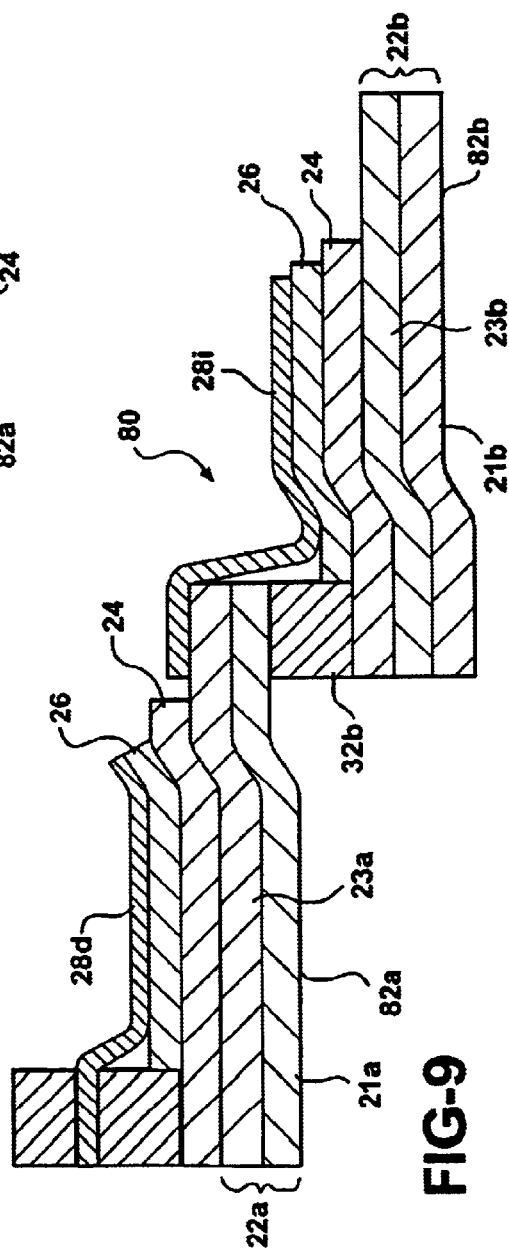

SERIES CONNECTED PHOTOVOLTAIC MODULE AND METHOD FOR ITS MANUFACTURE

FIELD OF THE INVENTION

This invention relates generally to photovoltaic devices. More specifically, the invention relates to photovoltaic modules comprised of two or more electrically interconnected photovoltaic cells. Most specifically, the invention relates to photovoltaic power generating modules, and methods for their manufacture, wherein the number of electrical interconnections between the cells comprising the module are minimized.

BACKGROUND OF THE INVENTION

Photovoltaic devices are nonpolluting and silent in operation. They are readily adapted to either a centralized or distributed power generating system, and growing in popularity as an alternative to fossil or nuclear powered electrical generation systems. The high cost and small size of single crystal photovoltaic devices has heretofore limited their utility; however, high volume processes for the manufacture of thin film semiconductor devices are now in commercial production, and very large area photovoltaic materials are being manufactured in continuous, roll-to-roll processes. The photovoltaic material produced in such processes is generally cut to size and fabricated into power generating modules which are comprised of a number of electrically interconnected photovoltaic cells selected to provide a desired output voltage and current. Such modules should have high power generating efficiency, and toward that end it is desirable to maximize the photovoltaically active surface of each cell. In addition, such modules should be rugged, low in cost and easy to fabricate. In addition, many applications require that such power generating modules be as light in weight as possible.

In view of these criteria, the prior art has developed a number of processes for fabricating large area photovoltaic materials into individual power generating cells and/or modules comprised of interconnected cells. U.S. Pat. Nos. 5,457,057; 5,681,402; and 5,759,291, the disclosure of which are incorporated herein by reference, show particular configurations of photovoltaic cells in which current collecting grid wires are employed to convey photovoltaically generated currents to a bus bar member. The disclosed structures maximize the photovoltaically active area of the devices; and in addition, are reliable, rugged and easily fabricated.

Referring now to FIGS. 1 and 2, there is shown a photovoltaic cell 20 of the prior art, which is generally similar to cells specifically disclosed in the U.S. Pat. No. 5,759,291 patent. FIG. 1 is a top plan view of the cell 20, and FIG. 2 is a cross-sectional view of that cell 20 taken along line 2—2 of FIG. 1. As is best seen in FIG. 2, the cell 20 includes a substrate electrode 22 having a body of photovoltaic material 24 disposed upon a topmost surface thereof. A top electrode 26 is disposed upon the upper surface of the photovoltaic body 24.

The photovoltaic body 24 is typically comprised of a number of layers of semiconductor material, and it operates to absorb incident photons and generate electron-hole pairs which are collected by the substrate electrode 22 and top electrode 26 to generate a photocurrent. The patents incorporated by reference herein describe some specific materials and configurations for the photovoltaic body; although, it is to be understood that the present invention may be implemented using various photovoltaic materials.

The substrate electrode 22 is, in some instances, fabricated from a sheet of electrically conductive material, such as a sheet of stainless steel, aluminum, electrically conductive polymer, cermet, degenerate semiconductor or the like, and it may include further layers thereupon, such as light reflective layers, texturizing layers and the like as is known in the art. In other instances, the substrate 22 may comprise a composite substrate such as a body of polymeric material having an electrically conductive coating, such as a coating of metal, non-metallic conductor or the like thereupon. Such composite substrates are particularly advantageous where the weight of the finished device is a concern. Again, the present invention may be implemented with all of such substrates. The top electrode 26 is transmissive of photovoltaically active wavelengths. One particularly preferred group of top electrode materials comprises transparent, electrically conductive oxide (TCO) material such as indium oxide, tin oxide, mixed oxides of indium and tin, and the like.

As is also seen in FIG. 2, a current collecting grid wire 28 is disposed upon the top, light incident, surface of the top electrode 26. This grid wire serves to collect photogenerated currents and convey them to a pair of current collecting bus bars 30a, 30b. Inclusion of this grid wire 28 is important, since the electrical conductivity of most TCO materials is fairly low; hence, the series resistance of the photovoltaic device 20 would be very high if the photocurrents had to travel laterally very far through the top electrode material. The grid wire 28 shortens this current path and provides a high conductivity conduit for the photo currents.

As further illustrated in FIG. 2, the bus bars 30a, 30b, as well as the end portions of the grid wire 28, are supported by an electrically insulating body 32a, 32b disposed upon the semiconductor body 24. This insulating body prevents the bus bar 30 and grid wire 28 from short circuiting through to the substrate 22. In one particularly preferred embodiment, and as is described in the '291 patent, this insulating body 32 is comprised of a double-sided adhesive tape which is applied to the semiconductor body 24 prior to the deposition of the top electrode material 26 thereupon. In other embodiments, and as is described in the patents incorporated by reference herein, this insulating body 32 may be disposed upon the substrate 22. Also, in some instances, the bus bars 30 may be directly affixed to the semiconductor body 24, and the grid wires bonded between the bus bar and semiconductor or atop the semiconductor body.

Referring now to FIG. 1, there is shown a top plan view of the device of FIG. 2. Visible in the figure is the top electrode material 26, grid wires 28a–28e, bus bars 30a, 30b and edge portions of the substrate 22.

As is described in the patents incorporated by reference herein, the photovoltaic cell material of FIGS. 1 and 2 can be electrically interconnected to form multi-cell modules. Such modules are typically configured as a series connected group of cells, and in that regard, an electrical connector is employed to establish a current path between the bus bar of one cell and the substrate of an adjacent cell. These interconnectors are typically soldered or welded, and FIGS. 11–13 of the '057 patent illustrate such interconnections. As is known and described in the art, the interconnected cells are typically laminated with an encapsulant material to produce a finished module.

While prior art technology as described hereinabove has produced high quality, high efficiency modules, the inventors hereof have recognized that the steps and structures associated with the formation of interconnections in accord with the prior art can be improved upon so as to maximize the efficiency, reliability and ease of fabrication of such photovoltaic modules.

As will be described in detail hereinbelow, the present invention provides a photovoltaic module in which the number of soldered or welded joints in the module is minimized thereby decreasing the likelihood of device failure and simplifying its manufacture. In addition, the structures of the present invention provide a highly redundant current path through the device which further enhances its reliability. The structures of the present invention are readily adaptable to the manufacture of very lightweight photovoltaic generator devices having ultra lightweight composite substrates. These and other advantages of the present invention will be apparent from the drawings, discussion and description which follow.

BRIEF DESCRIPTION OF THE INVENTION

There is disclosed herein a photovoltaic module which is comprised of a first and a second photovoltaic cell. Each cell has a substrate electrode, a top electrode, and a photovoltaic semiconductor body disposed therebetween in electrical communication with the substrate electrode and the top electrode. Each cell further includes a plurality of current collecting grid wires disposed atop, and in electrical contact with, the top electrode. The grid wires of a first cell are in electrical communication with a current collecting bus bar, and the grid wires of a second cell extend onto, and establish electrical contact with, the substrate electrode of the first cell so as to establish an unbroken current path therebetween and thereby create a series electrical connection between the first and the second cell. In a like manner, further cells may be added to the module.

In specific embodiments, the grid wires are adhesively affixed to the top electrode by an electrically conductive adhesive, and this adhesive may be precoated onto the exterior surface of the grid wires. In particular embodiments, the grid wire comprises a metallic core, which may be of circular or noncircular cross section, and one preferred core material comprises silver plated copper. The module may further include an encapsulant which protects and supports the interconnected cells.

In some configurations, the grid wires of the second cell extend onto an upper surface of the grid wires of the first cell; while in other instances, the grid wires of the second cell may contact the bottom surface of the substrate of the first cell. The present invention may be implemented in connection with prior art grid wire methodology; and in that regard, the grid wires may pass onto an electrically insulating body disposed on each cell, in which instance, the bus bar of the first cell may be affixed to that insulating body in electrical contact with the grid wires thereof.

Also disclosed herein are methods for manufacturing the photovoltaic modules of the present invention, and such methods comprise providing a first and a second photovoltaic cell each comprised of a substrate electrode, a top electrode and a photovoltaic semiconductor body disposed therebetween in electrical communication with the substrate electrode and the top electrode. According to this method, a plurality of current collecting grid wires are disposed atop the top electrode of the first cell in electrical contact therewith, and a current collecting bus bar is disposed so as to establish electrical contact with the grid wires of the first cell. A plurality of grid wires are affixed to the top electrode of the second cell so as to establish electrical contact therewith and the wires of this plurality are extended from the second cell to the substrate electrode of the first cell so as to establish electrical contact therewith. The wires of the second plurality each provide an unbroken current path between the two cells so as to establish a series electrical connection therebetween.

BRIEF DESCRIPTION OF THE DRAWINGS

FIG. 1 is a top plan view of a photovoltaic cell of the prior art which employs grid wire technology;

FIG. 2 is a cross-sectional view of the device of FIG. 1 taken along line 2—2;

FIG. 3 is a cross-sectional view of one embodiment of grid wire which may be employed in the practice of the present invention;

FIG. 4 is a top plan view of a module structured in accord with the principles of the present invention;

FIG. 5 is a cross-sectional view of the module of FIG. 4 taken along line 5—5;

FIG. 6 is a top plan view of another module structured in accord with the principles of the present invention;

FIG. 7 is a cross-sectional view of the module of FIG. 6 taken along line 7—7;

FIG. 8 is a top plan view of the lightweight module of the present invention;

FIG. 9 is a cross-sectional view of the lightweight module of FIG. 8 taken along line 9—9;

DETAILED DESCRIPTION OF THE INVENTION

Figure 10:
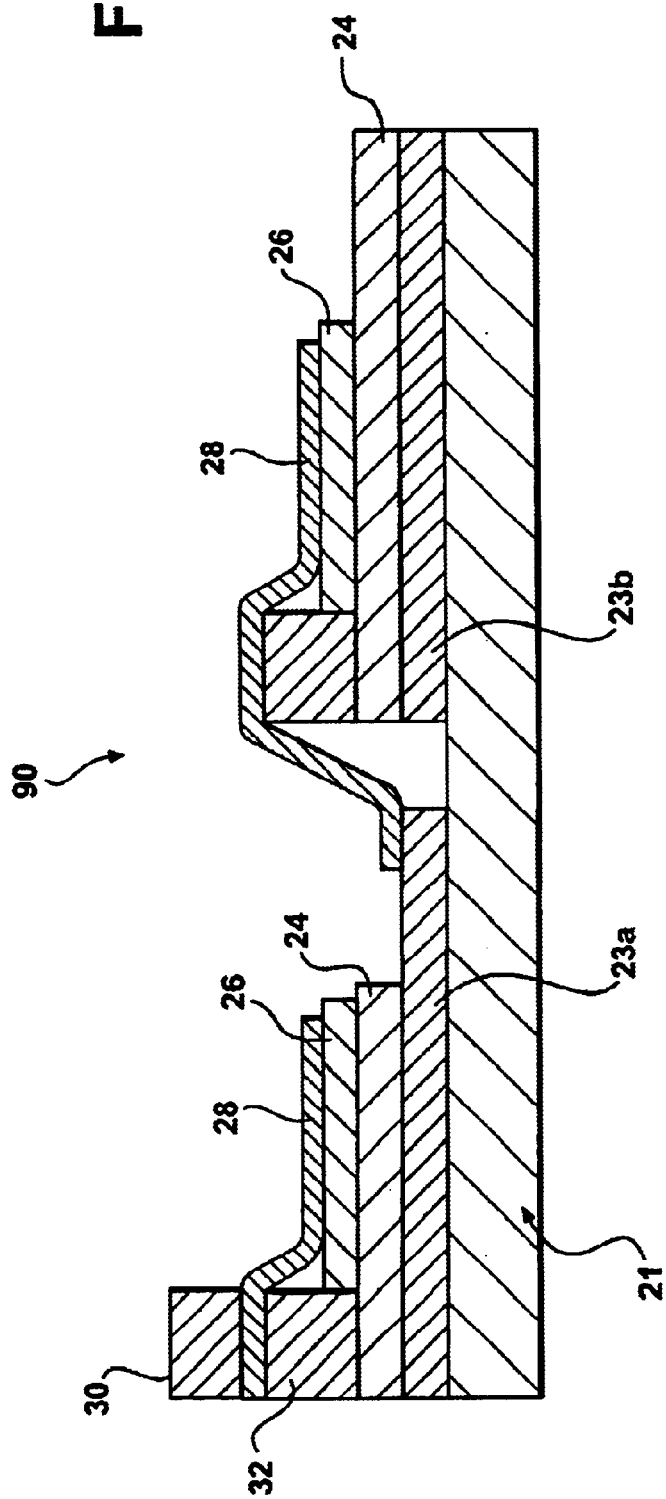
FIG. 10 is a cross-sectional view of another configuration of module structured in accord with the principles of the present invention.

In accord with the principles of the present invention, electrical interconnections between individual photovoltaic cells comprising power generating modules are provided by extending the current collecting grid wires from one of the cells onto an electrode portion of another of the cells. Doing so establishes an unbroken current path between the cells, and eliminates the need for employing jumper connections or the like, and thereby eliminates the number of junctions, such as solder joints, welded connections or the like, in the device thereby increasing the reliability of the device and simplifying its manufacture. In addition, the present invention provides a high degree of redundancy in the interconnection thereby increasing the reliability of the device. This invention will be described with reference to specific, series-connected, module configurations. It is to be understood that the invention may be practiced with other configurations of modules, including parallel and series-parallel connected modules.

Referring now to FIG. 4, there is shown a top plan view of a two cell module structured in accord with the principles of the present invention. This module 40 is comprised of two cells 42a and 42b, and these cells are generally similar to the cell described with reference to FIG. 2, and like structures will be referred to by like reference numerals. Visible in FIG. 4 are bus bars 30a, 30b, 30c, 30d as well as the top electrodes 26 of each cell 42a, 42b and a portion of the substrate 22 of each cell 42a, 42b. FIG. 4 further illustrates the grid wires 28a–28e associated with the first cell 42a, and the grid wires 28f–28j associated with the second cell 42b. As is apparent in FIG. 4, the grid wires 28f–28j of the second cell 42b extend onto, and establish electrical contact with, the exposed portion of the substrate 22a of the first cell 42a.

Referring now to FIG. 5, there is shown a cross-sectional view of the module 40 of FIG. 4 taken along lines 5—5. As will be seen from FIG. 5, each of the cells 42a, 42b includes a substrate 22, i.e. 22a, 22b, which, as discussed above with regard to FIGS. 1 and 2, may be a metallic substrate or a composite substrate. The substrate 22 functions to provide a bottom electrode for the cell, and in this regard, at least the topmost surface thereof must be electrically conductive.

Atop the substrate 22 is photovoltaic semiconductor body 24 which operates to generate a photocurrent in response to absorbed illumination. As previously noted, this body typically comprises a plurality of layers of semiconductor material. Atop the semiconductor body 24 is a top electrode 26 which, in this embodiment, is a transparent, electrically conductive electrode formed from a TCO material. In some instances, further layers, such as current buffering layers, reflective layers, and the like, may be interposed between the semiconductor body 24 and either the substrate electrode 22 or the top electrode 26. Each cell includes a grid wire 28 which is in electrical contact with the top electrode 26. This grid wire 28 functions, as described above, to collect photogenerated current from the top electrode 26 and provide a low resistivity current path there across. As illustrated, the grid wire 28d of the first cell 42a is in electrical contact with bus bars 30a, 30b of that cell. Similarly, the grid wire 28i of the second cell 42b is in electrical contact with bus bars 30c, 30d of its cell. In each instance, an electrically insulating body 32 is affixed to each cell, and provides a contact point at which the grid wires 28 contact the bus bars 30. As is shown in FIG. 5, the grid wire 28i of the second cell 42b extends beyond its point of contact with the bus bar 30c and establishes electrical contact with a portion of the substrate electrode 22a of the first cell 42a through an unbroken current path. In this manner, a series electrical connection is established between the two cells. This mode of connection eliminates the need for employing separately affixed jumpers and thereby eliminates at least one electrical connection which could present a failure point in the module. Furthermore, since each cell includes a plurality of grid wires, redundancy in the assembly is provided.

It is to be understood that while the present disclosure refers to the grid members as "wires", this is for convenience of discussion and should not be construed as limiting the wires to bodies having circular cross sections. Nor shall the description be construed as being limited to metallic wires. The grid wires of the present invention also include non-metallic, electrically conductive materials and composites. The grid wires may be configured as tapes or as members having otherwise flattened surfaces. For example, the grid wires may comprise members having a semi-circular cross section. Referring now to FIG. 3, there is shown a cross-sectional view of one embodiment of grid wire which may be employed in the present invention. The grid wire of FIG. 3 comprises a metallic core which is a copper wire 44 having a silver plated coating 46 thereupon. The core is coated with an electrically conductive adhesive composition 48. The adhesive 48 may comprise a thermoplastic, hot melt adhesive which is preferably rendered electrically conductive by the inclusion of particles of silver, carbon or similar material. In another embodiment, the adhesive 48 is a solvent-based adhesive, typically a mixture of polymer solution together with conductive particles as noted above. The wire core is preferably 50–100 microns in thickness, and the adhesive coating is approximately 10–50 microns thick. In one preferred embodiment, the resistivity of the adhesive layer is in the range of 0.1–10 ohm centimeter. Further descriptions of suitable grid wire structures will be found in the patents incorporated herein by reference.

Referring now to FIG. 6, there is shown a top plan view of another embodiment of module 60 structured in accord with the principles of the present invention. This module 60 is formed from two cells 62a, 62b which are somewhat similar to the cells previously described; although, certain structures thereof have been simplified. FIG. 7 is a cross-sectional view of the module 60 of FIG. 6 taken along lines 7—7. FIG. 7 better illustrates the structure of the cells 62a, 62b. As in the previous embodiments, each cell includes a substrate 22, semiconductor body 24, top electrode 26 and grid wires 28 as previously described. However, the basic structure of the cells 62a, 62b of FIG. 7 is somewhat simplified as compared to those previously described.

Cell 62a includes only one bus bar 30a and only one electrically insulating body 32a. The opposite side of the cell only includes an exposed portion of substrate 22. Also, it will be noted that the body of top electrode material 26 is slightly stepped back from the edge of the semiconductor body 24. This feature is not essential to the present invention, and the top electrode layer 26 may be carried directly to the edge of the semiconductor body 24; however, in such instance, there is a danger of the relatively high conductivity top electrode 26 short circuiting through to the substrate electrode 22. Since the semiconductor body 24 is of relatively high resistivity, as compared to the two electrodes, stepping the top electrode back as shown eliminates this short circuiting danger. Such techniques for depositing stepped layers are well known to those of skill in the art and may be readily implemented.

Also apparent from FIG. 7 is the fact that the second cell 62b does not include any bus bar structure at all. The grid wire 28i passes across the top electrode 26 and crosses the insulating body 32c and establishes electrical contact with the substrate 22 of the first cell 62a, as in the previous embodiment. Elimination of the excess bus bars in this embodiment decreases the overall weight of the module and allows for an increased photovoltaically active area. The insulating body 32 may, as discussed above, be eliminated or further minimized; however, inclusion of the insulating body does facilitate module formation and minimizes the possibility of short circuiting.

Yet other configurations of module may be structured in accord with the principles of the present invention. Referring now to FIG. 8, there is shown a lightweight module 80. This module is comprised of two cells 82a, 82b disposed in an overlapping, "shingled" relationship. FIG. 9 is a cross-sectional view of the module 80 of FIG. 8. The general configuration of the cells 82a, 82b is similar to that of the cells 62a, 62b of the FIGS. 6 and 7 embodiments. However, the cells 82 of the FIGS. 8 and 9 embodiments are formed upon a lightweight, composite substrate. In this regard, the substrate 22 is comprised of a first layer of polymeric material 21, i.e. 21a, 22b, having a metallized layer 23 deposited there atop. One preferred polymeric material for the composition substrate is a polyamide, such as the polymer sold by the DuPont Corporation under the name Kapton®.

Substrates of this type are thinner, and also lighter than substrates which are completely metallic. Furthermore, such substrates are very flexible; and accordingly, the individual cells 82a, 82b in the FIG. 9 embodiment can be disposed in an overlapping, shingled relationship such that the bottom, electrically insulating, surface of the substrate 22a of the first cell 82 overlies the insulating body 32b of the second cell 82b. This configuration further increases the photovoltaically active area of the resultant module. Given the fact that the bottom surface of the substrate 22a of the first cell 82a is electrically insulating, in further embodiments of this type of device, the electrically insulating body 32b of the second cell 82b may be eliminated, in which instance the bottom surface of the substrate 22a of the first cell 82a will lie directly on either the semiconductor body 24 or top electrode 26 of the second cell 82b FIG. 10 shows yet another embodiment of module 90 in accord with the present invention. This module includes features in common with the modules of FIGS. 6–9, and like structures are numbered accordingly. The module 90 of FIG. 10 is an ultralight module which is fabricated upon a lightweight, electrically insulating polymeric substrate 21, such as the polyamide material described with reference to the embodiment of FIGS. 8 and 9. In this embodiment, substrate electrodes 23a and 23b are disposed on the substrate 21. These electrodes 23 may comprise metallized regions or other such electrically conductive bodies. The discrete electrodes 23 can be formed by depositing a metal layer onto the polymeric substrate 21, and patterning that layer by etching, selective disposition or the like, as is known in the art. The remaining structure of the module 90 is as previously described, for example, with regard to FIG. 7.

Figure 11:
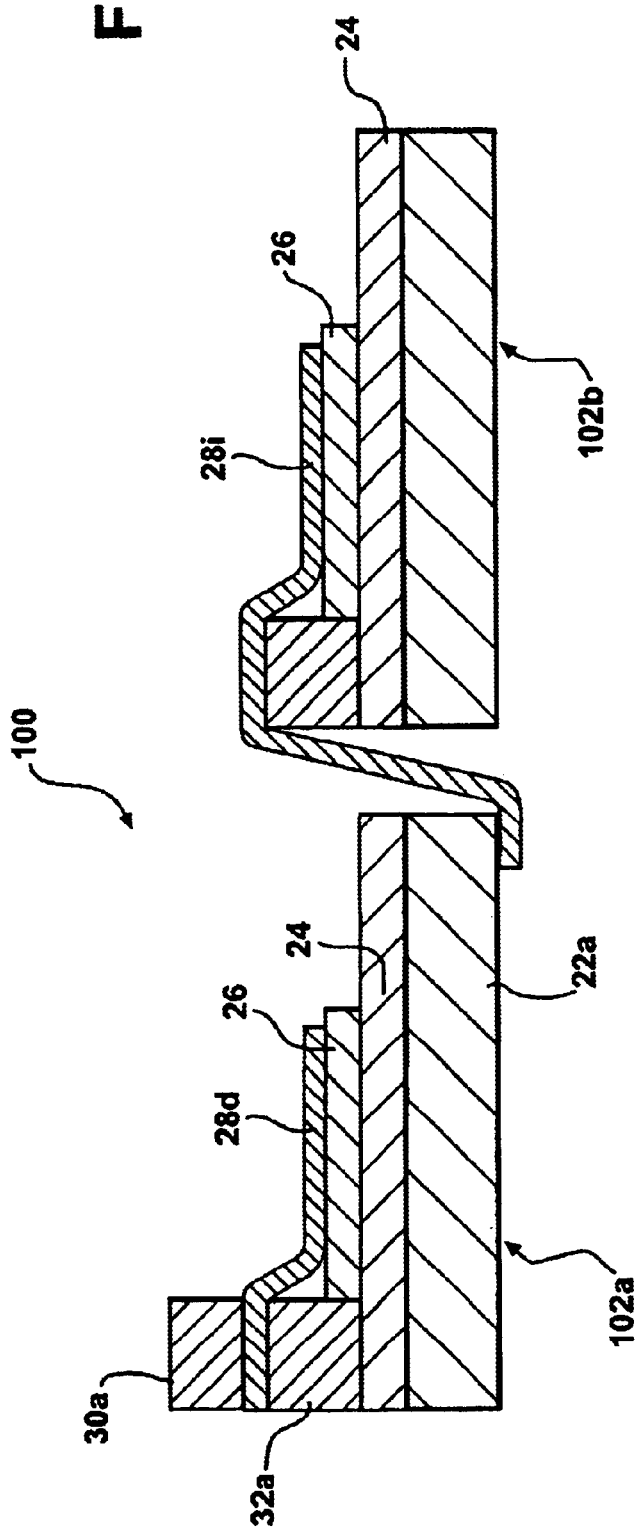
FIG. 11 is a cross-sectional view of yet another embodiment of module structured in accord with the present invention.

Yet other configurations of module are possible within the scope of the present invention. For example, FIG. 11 shows a module 100 comprised of two cells 102a, 102b which are generally similar to the cells shown in FIG. 7 except that the substrates 22 do not project beyond semiconductor body 24. And in the module configuration, the grid wires, for example wire 28i of the second cell 102b, establish electrical contact with a bottom surface of the substrate 22a of the first cell 102a. This configuration maximizes the photovoltaically active area of the module.

Although not illustrated, it is to be understood that in most instances the modules will be encapsulated in a protective material, such as a polymeric encapsulant. One preferred encapsulant comprises a fluoropolymer sold under the name Tefzel by the DuPont Corporation and the laminating adhesive used to apply the encapsulant layer preferably comprises an ethylene vinyl acetate hot melt adhesive. Encapsulated modules formed from interconnected cells are disclosed in the aforementioned U.S. Pat. No. 5,457,057. Yet other variations of the present invention will be readily apparent to one of skill in the art. For example, the modules will typically include more than two cells, and in addition to the series interconnections shown herein, the individual cells of the modules may be connected in parallel and in mixed series-parallel relationships.

While the present invention has particular advantage in connection with the manufacture of modules from cells based upon hydrogenated semiconductor alloys of silicon, germanium and silicon-germanium, this technology may be likewise implemented with other photovoltaic materials such as polycrystalline silicon, cadmium selenide, cadmium sulfide, gallium arsenide and the like.

The foregoing drawings, discussion and description are illustrative of some specific embodiments of the present invention, but they are not meant to be limitations upon the practice thereof. It is the following claims, including all equivalents, which define the scope of the invention.

What is claim is:

1. A photovoltaic module comprising:
    a first and a second photovoltaic cell, each cell being disposed on a respective substrate, and each cell comprising a substrate electrode, a top electrode, and a photovoltaic semiconductor body disposed therebetween in electrical communication with said substrate electrode and said top electrode, each cell further including a plurality of current collecting grid wires disposed atop said top electrode, in electrical contact therewith; wherein, the grid wires of said first cell are in electrical communication with a current collecting bus bar; and
    the grid wires of said second cell extend beyond said second solar cell onto, and establish electrical contact with, the substrate electrode of said first cell so as to establish an unbroken current path therebetween; whereby, a series electrical connection is established between said first cell and said second cell; and wherein said first and second cells are disposed in a shingled relationship so that a portion of the substrate of one of said first and second cells overlies a portion of the other of said first and second cells.

2. The module of claim 1, wherein for each of said cells, the respective substrate electrode has a topmost side disposed closest to the body of semiconductor material and a bottommost side which is disposed farthest from the body of semiconductor material, wherein the plurality of wires of said second cell establish electrical contact with the topmost side of the substrate electrode of said first cell.

3. The module of claim 1, wherein for each of said cells, the respective substrate electrode has a topmost side disposed closest to the body of semiconductor material and a bottommost side which is disposed farthest from the body of semiconductor material, wherein the plurality of wires of said second cell establish electrical contact with the bottommost side of the substrate electrode of said first cell.

4. The photovoltaic module of claim 1, wherein each of said cells includes an electrically insulating body, and wherein the grid wires of each cell extend across the electrically insulating body thereof.

5. The module of claim 4, wherein said electrically insulating body is adhesively affixed to the respective cell.

6. The module of claim 5, wherein said electrically insulating body comprises an electrically insulating member having an adhesive coating on an upper and a lower surface thereof.

7. The module of claim 4, wherein said bus bar is adhesively affixed To the electrically insulating body of said first cell.

8. The module of claim 1, wherein said substrate is metallic and said substrate electrode is defined by a portion of the thickness of said metallic substrate.

9. The module of claim 1, wherein said substrate includes a light reflective coating thereupon.

10. The module of claim 1, wherein said substrate is a composite comprising a layer of polymeric material having a layer of electrically conductive material comprising said substrate electrode supported thereupon.

11. The module of claim 1, wherein said photovoltaic body comprises a thin film semiconductor body.

12. The module of claim 1, wherein said photovoltaic body includes at least one layer comprised of a group IV semiconductor material.

13. The module of claim 12, wherein group IV semiconductor material comprises a hydrogenated alloy of a member selected from the group consisting of: silicon, germanium, and silicon-germanium.

14. The module of claim 1, wherein said semiconductor body includes at least one P-I-N triad comprised of a layer of substantially intrinsic semiconductor material interposed between oppositely doped layers of semiconductor material.

15. The module of claim 14, wherein said semiconductor body comprises a plurality of said P-I-N triads stacked in an optical and electrical series relationship.

16. The module of claim 1, wherein the grid wires of each cell are affixed to the top electrode thereof by an electrically conductive adhesive.

17. The module of claim 16, wherein said wires comprise a metallic core having said electrically conductive adhesive coated thereupon.

18. The photovoltaic module of claim 17, wherein said metallic core comprises a silver-coated, copper wire, and said electrically conductive adhesive includes carbon particles therein.

19. The module of claim 1, wherein said top electrodes of said first and second cells comprise a layer of a transparent electrically conductive oxide material.

20. The module of claim 1, further including a body of encapsulant material enclosing said first and second cells.

21. The module of claim 1, further including a third photovoltaic cell, said third cell disposed on a substrate and comprising a substrate electrode, a top electrode, and a photovoltaic semiconductor body disposed therebetween in electrical communication with said substrate electrode and said top electrode, said third cell further including a plurality of current collecting grid wires disposed atop its top electrode, in electrical contact therewith; wherein the grid wires of said third cell extend onto, and establish electrical contact with the substrate electrode of said second cell so as to establish an unbroken current path therebetween; whereby a series electrical connection is established between said first cell, said second cell, and said third cell.

22. A photovoltaic module comprising:
a first and a second photovoltaic cell, each cell being disposed on a respective substrate, and each cell comprising a substrate electrode, a top electrode, and a photovoltaic semiconductor body disposed therebetween in electrical communication with said substrate electrode and said top electrode, each cell further including a plurality of current collecting grid wires disposed atop said top electrode, in electrical contact therewith; wherein, the grid wires of said first cell are in electrical communication with a current collecting bus bar;
the grid wires of said second cell extend beyond said second solar cell onto said first cell so as to establish an unbroken current path therebetween; and
said first and second cells are disposed in a shingled relationship so that a portion of the substrate of one of said first and second cells overlies a portion of the other of said first and second cells.

23. The module of claim 22, wherein said grid wires of said second cell are in electrical communication with the top electrode of said first cell; whereby a parallel electrical connection is established therebetween.

24. A method of making a photovoltaic module comprising:
providing a first and a second photovoltaic cell, each cell being disposed on a respective substrate, and each cell comprising a substrate electrode, a top electrode, and a photovoltaic semiconductor body disposed therebetween in electrical communication with said substrate electrode and said top electrode, each cell further including a plurality of current collecting grid wires disposed atop said top electrode, in electrical contact therewith; wherein, the grid wires of said first cell are in electrical communication with a current collecting bus bar;
disposing said first and second cells in a shingled relationship so that a portion of the substrate of one of said first and second cells overlies a portion of the other of said first and second cells; and
extending the grid wires of said second cell beyond said second solar cell onto the substrate electrode of said first cell so as to establish an unbroken current path therebetween; whereby, a series electrical connection is established between said first cell and said second cell.

* * * * *